United States Patent
Prabhu et al.

(10) Patent No.: US 10,891,072 B2
(45) Date of Patent: Jan. 12, 2021

(54) NAND FLASH THERMAL ALERTING

(71) Applicant: Micron Technology, Inc., Boise, ID (US)

(72) Inventors: Naveen Vittal Prabhu, Folsom, CA (US); Aliasgar S. Madraswala, Folsom, CA (US); Simon Ramage, Vancouver (CA)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/826,865

(22) Filed: Mar. 23, 2020

(65) Prior Publication Data
US 2020/0301601 A1   Sep. 24, 2020

Related U.S. Application Data

(63) Continuation of application No. 16/417,069, filed on May 20, 2019, now Pat. No. 10,599,362, which is a continuation of application No. 15/800,958, filed on Nov. 1, 2017, now Pat. No. 10,331,377.

(51) Int. Cl.
*G11C 7/04* (2006.01)
*G06F 3/06* (2006.01)
*G11C 29/52* (2006.01)
*G11C 29/44* (2006.01)

(52) U.S. Cl.
CPC .......... *G06F 3/0653* (2013.01); *G06F 3/0604* (2013.01); *G06F 3/0679* (2013.01); *G11C 7/04* (2013.01); *G11C 29/44* (2013.01); *G11C 29/52* (2013.01)

(58) Field of Classification Search
CPC ... G11C 7/04; G11C 11/406; G11C 11/40628; G11C 5/147; G11C 5/143
USPC .......................................................... 365/211
See application file for complete search history.

(56) References Cited

U.S. PATENT DOCUMENTS

| 7,936,616 | B2 | 5/2011 | Jeong |
| 9,342,443 | B2* | 5/2016 | Walker .................. G06F 1/3275 |
| 9,361,969 | B2 | 6/2016 | Kim et al. |
| 10,331,377 | B2 | 6/2019 | Prabhu et al. |
| 10,599,362 | B2 | 3/2020 | Prabhu et al. |
| 2008/0052483 | A1 | 2/2008 | Rangarajan et al. |
| 2009/0003044 | A1 | 1/2009 | Happ et al. |

(Continued)

FOREIGN PATENT DOCUMENTS

| CN | 111465986 A | 7/2020 |
| WO | WO-2019089350 A1 | 5/2019 |

OTHER PUBLICATIONS

"International Application Serial No. PCT/US2018/057556, International Preliminary Report on Patentability dated May 14, 2020", 8 pgs.

(Continued)

*Primary Examiner* — Son T Dinh
(74) *Attorney, Agent, or Firm* — Schwegman Lundberg & Woessner, P.A.

(57) ABSTRACT

Devices and techniques for NAN flash thermal alerting are disclosed herein. A NAND array operation is received at a controller of a storage device that includes a NAND array. The controller evaluates a thermal condition of the NAND array in response to receipt of the NAND array operation. The controller then communicates the thermal condition along with a result of the NAND array operation.

24 Claims, 15 Drawing Sheets

(56) References Cited

U.S. PATENT DOCUMENTS

| | | |
|---|---|---|
| 2013/0275665 A1 | 10/2013 | Saraswat et al. |
| 2015/0092488 A1 | 4/2015 | Wakchaure et al. |
| 2017/0060202 A1 | 3/2017 | Sundaram et al. |
| 2017/0269669 A1 | 9/2017 | Choi et al. |
| 2019/0129648 A1 | 5/2019 | Prabhu et al. |
| 2020/0019337 A1 | 1/2020 | Prabhu et al. |

OTHER PUBLICATIONS

"International Application Serial No. PCT/US2018/057556, International Search Report dated Feb. 13, 2019", 3 pgs.
"International Application Serial No. PCT/US2018/057556, Written Opinion dated Feb. 13, 2019", 6 pgs.
U.S. Appl. No. 15/800,958, filed Nov. 1, 2017, NAND Flash Thermal Alerting, U.S. Pat. No. 10,331,377.
U.S. Appl. No. 16/417,069, filed May 20, 2019, NAND Flash Thermal Alerting, U.S. Pat. No. 10,599,362.

* cited by examiner

NAND FLASH THERMAL ALERTING

PRIORITY APPLICATION

This application is a continuation of U.S. application Ser. No. 15/417,069, filed May 20, 2019, which is a continuation of U.S. application Ser. No. 15/800,958, filed Nov. 1, 2017, issued as U.S. Pat. No. 10,331,377, all of which are incorporated herein by reference in their entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
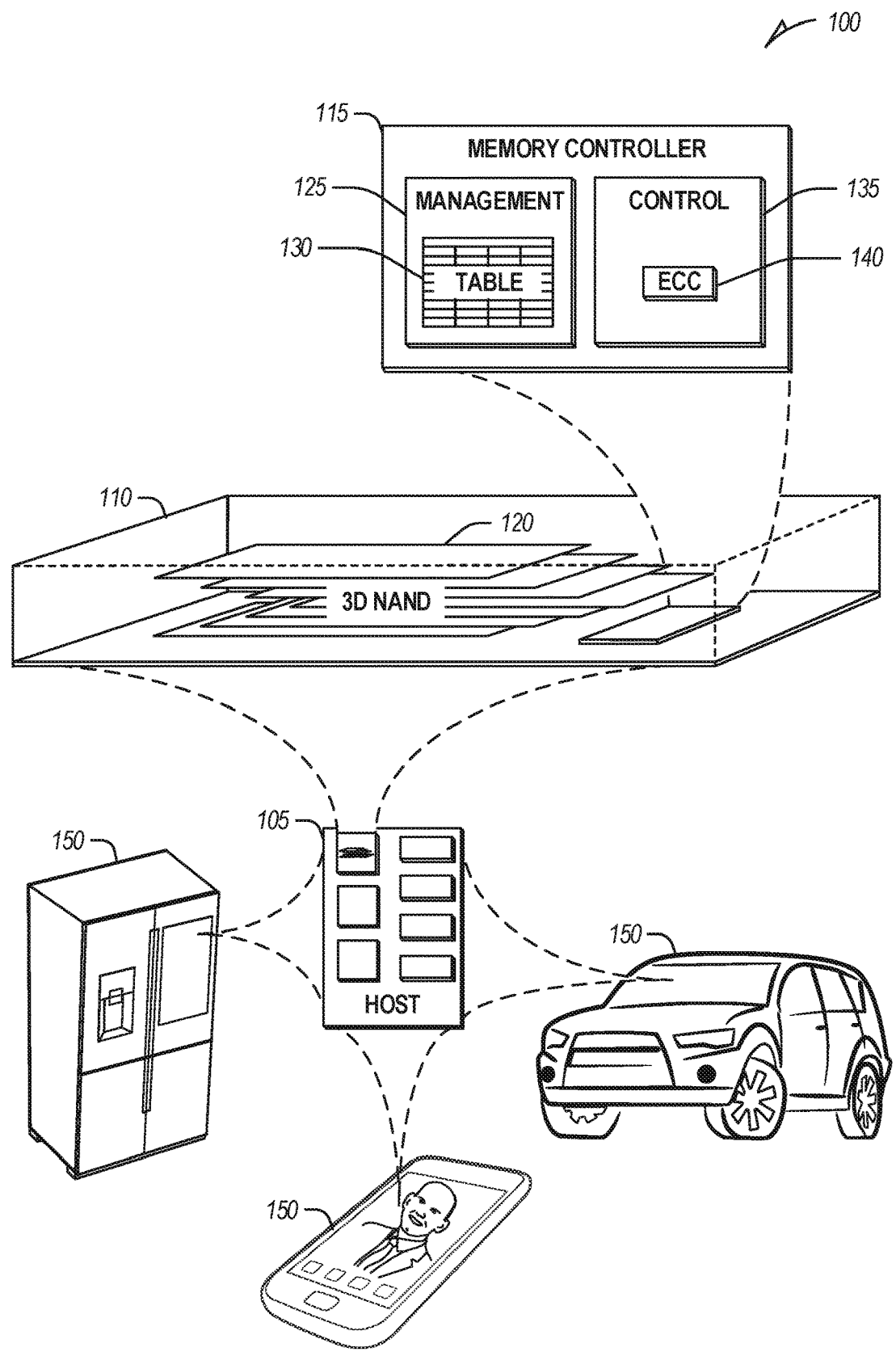
FIG. 1 illustrates an example of an environment including a memory device.

NAND flash relies on accurate voltage levels on a charge trap or floating gate to determine data stored on a cell. The operating temperature of a device may affect trapped charge distributions on cells. Generally, a very hot device results in greater charge trapping and dissipation while a cold device has the opposite effect. Due to the temperature dependent nature of the underlying storage mechanism, a controller of the NAND flash, or a host, benefits from ascertaining the temperature of the device at various times. Generally, the temperature is ascertained via a bus command to poll NAND flash die that often include a thermometer for the die—e.g., the temperature is polled using MLBi (1.5 us) or get feature method (120 us). Based on temperature range, an operation may be throttled or a compensation algorithm may be triggered to adjust read offsets, for example. However, a problem arises in dense storage arrays because MLBi or get feature commands add large overhead polling die in devices with high die counts.

To address this issue, a more efficient method of monitoring the temperature on each NAND die is proposed. In an example, if temperature on NAND reaches above or below a set threshold, then temperature status with respect to this threshold is provided (e.g., the host is notified) through a designated thermal alert status register bit. This eliminates the overhead and complexity of polling the temperature on each NAND die.

The technique results in notifying the host that the NAND is operating beyond a normal temperature range rather than reporting the temperature. In an example, the notification may be provided automatically (e.g., without being requested) at the end of valid array operations. Here, upon execution of the valid array operation, an embedded temperature sensor is queried to determine the temperature that is then compared against the threshold. The status bit then is included with the result of the operation to indicate whether the temperature is within the threshold or not. In an example, the host may configure threshold such that the status register can reflect thermal window detection (e.g., within a window) or thermal level detection (e.g., above or below a given temperature).

Following this technique simplifies NAND temperature acquisition for NAND die, reduces overhead (e.g., there is less signaling), and improves quality of service. Thus, a small (e.g., one bit) overhead on many operations is traded for the linearly proportional to storage array size polling techniques of the past. Additional details and examples are provided below.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 1500 of FIG. 15.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

As noted above, the memory controller 115 is arranged to receive a NAND array operation. In an example, the NAND array operation is read page. In an example, the NAND array operation is read cache sequence. In an example, the NAND array operation is read cache random. In an example, the NAND array operation is read cache last. In an example, the NAND array operation is snap read. In an example, the NAND array operation is read retry. In an example, the NAND array operation is moving read reference. In an example, the NAND array operation is corrective read. In an example, the NAND array operation is soft read. In an example, the NAND array operation is channel calibration. In an example, the NAND array operation is single bit soft read. In an example, the NAND array operation is program. In an example, the NAND array operation is one-time-programmable (OTP) program. In an example, the NAND array operation is cache program. In an example, the NAND array operation is erase suspend and resume. In an example, the NAND array operation is auto erase suspend. In an example, the NAND array operation is program resume. In an example, the NAND array operation is program suspend and resume.

In an example, the NAND array operation is not set feature. In an example, the NAND array operation is not get feature. In an example, the NAND array operation is not media-local-bus interface (MLBi). In an example, the NAND array operation is not enhanced media-local-bus interface (eMLBi). In an example, the NAND array operation is not program suspend. In an example, the NAND array operation is not read unique identification (ID). In an example, the NAND array operation is not read parameter page. In an example, the NAND array operation is not reset. In an example, the NAND array operation operates on a die of the NAND array.

The memory controller 115 is arranged to evaluate a thermal condition of the NAND array in response to receipt of the NAND array operation. In an example, evaluating the thermal condition includes retrieving a temperature from a thermometer of the die. Thus, in this case, the die is queried by the memory controller 115 as each operation is performed. In an example, evaluating the thermal condition includes applying a quantification to the temperature. The quantification is a reduced resolution representation of the temperature, such as rounding the temperature to a nearest degree, or degree increment (e.g., five degree increments). In an example, the quantification is selected from a finite set of quantifications. For example, the quantifications may be very cold, cold, acceptable, hot, and very hot.

In an example, evaluating the thermal condition includes comparing the temperature to a threshold. In an example, the finite set of quantifications has two members: a first member to indicate that the thermal condition is beyond the threshold and a second member to indicate that the thermal condition is not beyond the threshold. These examples illustrate a binary quantification whereby the quantification assess whether the die is within or without the operationally parameters as defined by the threshold.

In an example, the threshold is a temperature range. In this example, the threshold is defined by two values, a maximum and a minimum temperature. In an example, the first member indicates that the temperature is outside of the range and the second member indicates that the temperature is within the range.

In an example, the range is set at the controller by a MLBi command from the host 105. Thus, the host 105 may define the threshold that is used by the memory controller 115 to quantize the temperature. In an example, the temperature range has a lower bound of negative thirty-seven degrees Celsius and an upper bound of ninety degrees Celsius with a resolution of one degree Celsius. In an example, the temperature range has a lower bound of negative thirty-seven degrees Celsius and an upper bound of one hundred and twenty five degrees Celsius with a resolution of one degree Celsius. In an example, the memory controller 115 is arranged to disable the evaluation of the thermal condition in response a range setting with a lower bound or upper bound outside of a pre-determined values. This example illustrates a convenient signaling mechanism for the host 105 to disable the temperature reporting by the memory controller 115. Thus, the host 105 may set the lower bound of the temperature beyond the sensing range for the thermometers, or another predetermined value, and do the same for the high temperature, to cause the memory controller 115 to stop its temperature reporting activities. Similarly, if the host 105 wants to know if the temperature is above 100 C, for example, the host 105 may set the lower bound beyond the predetermined value and set the upper bound at 100 C. Now, the temperature signaling will report temperatures in excess of 100 C as beyond the threshold but avoid any such signal on lower temperatures.

After the thermal condition is evaluated, the memory controller 115 is arranged to communicate the thermal condition along with a result of the NAND array operation. In an example, communicating the thermal condition includes setting a status bit with first member value or a second member value. In an example, the status bit is bit three in a status register for the NAND array operation. In an example, the status bit is not changed until a reset operation or another NAND array operation for the die. Thus, the status bit may be queried multiple times by the host 105 without incurring another operation on the array 120.

Figure 2:
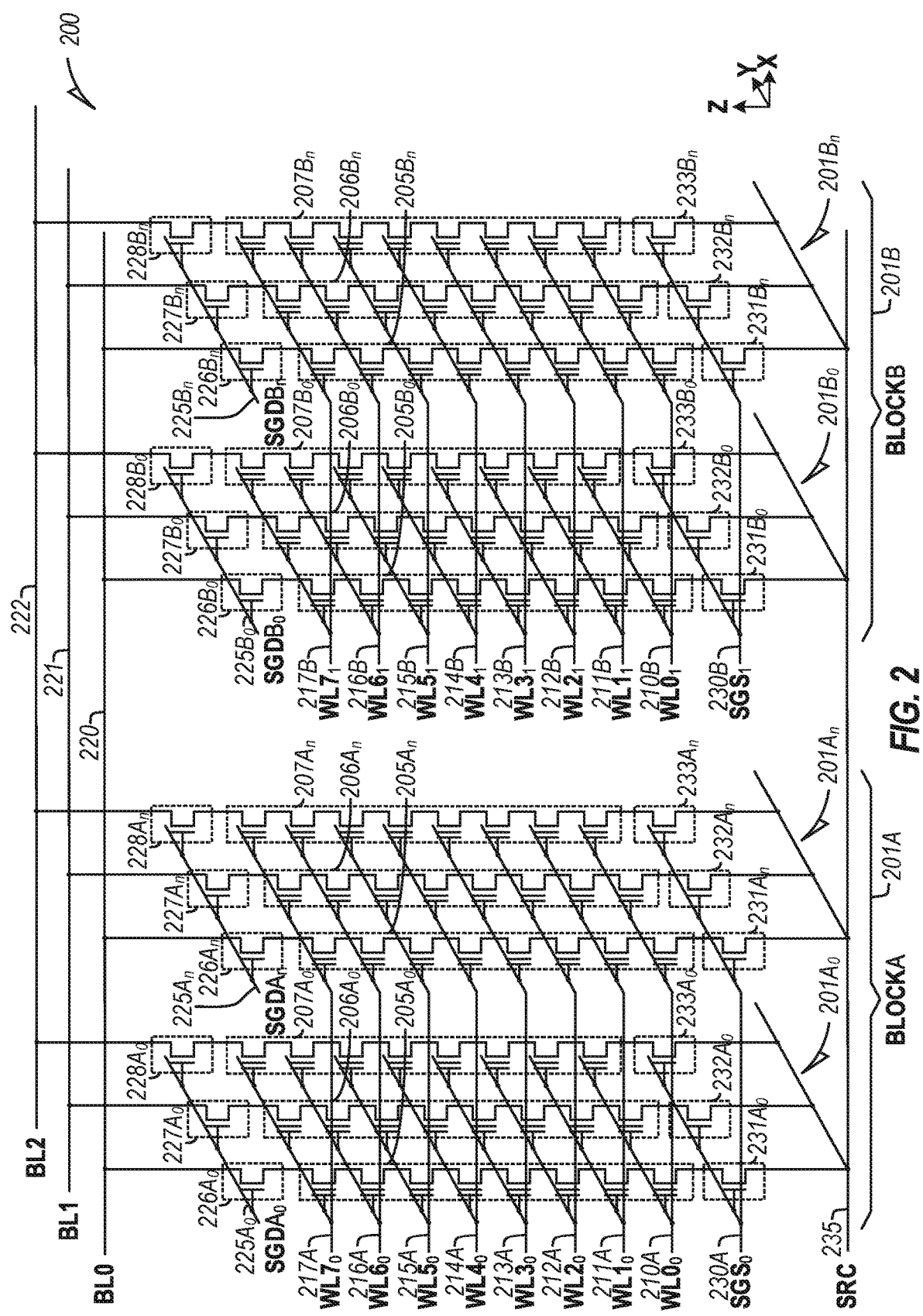
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-

228$B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
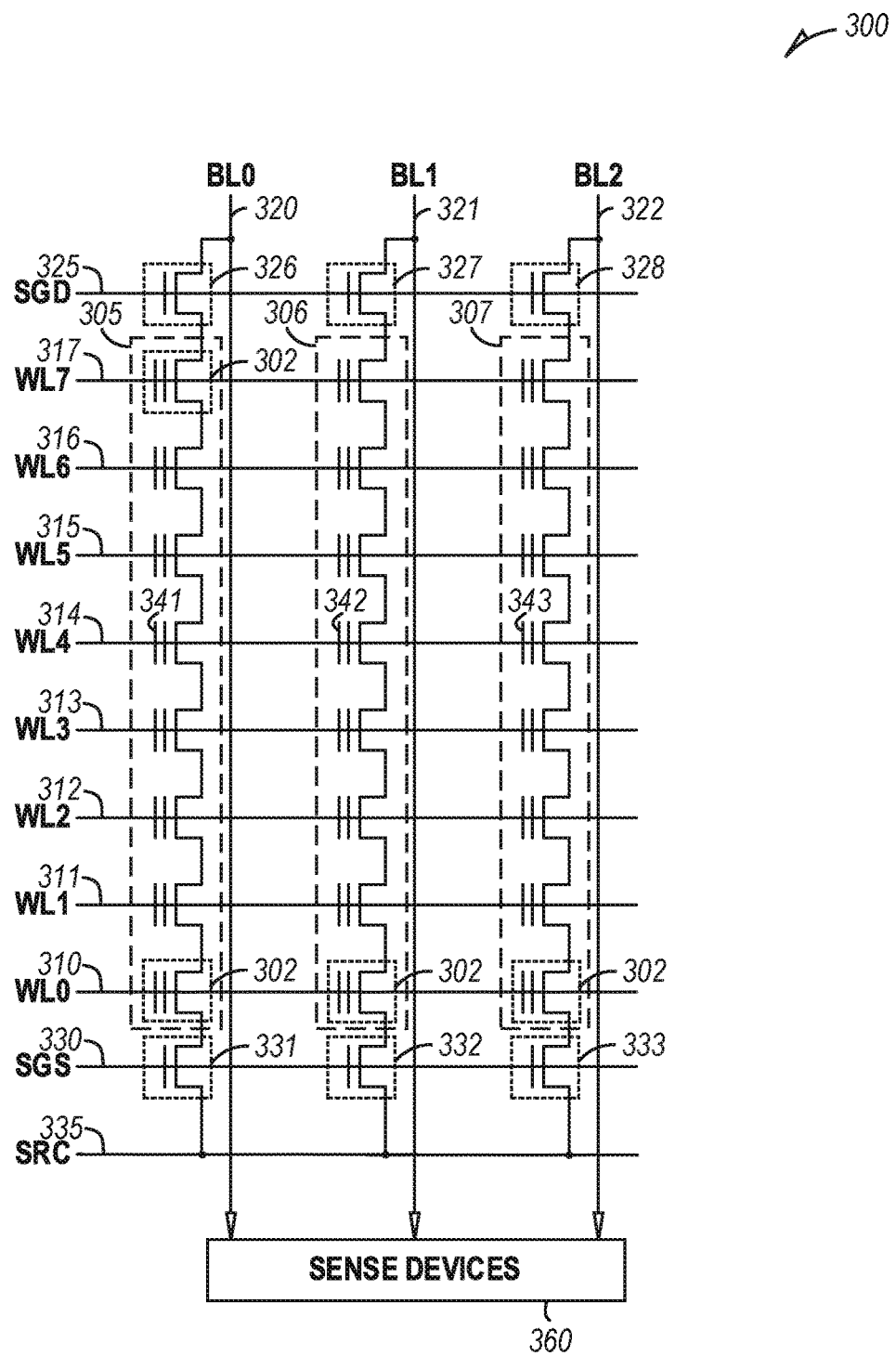

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
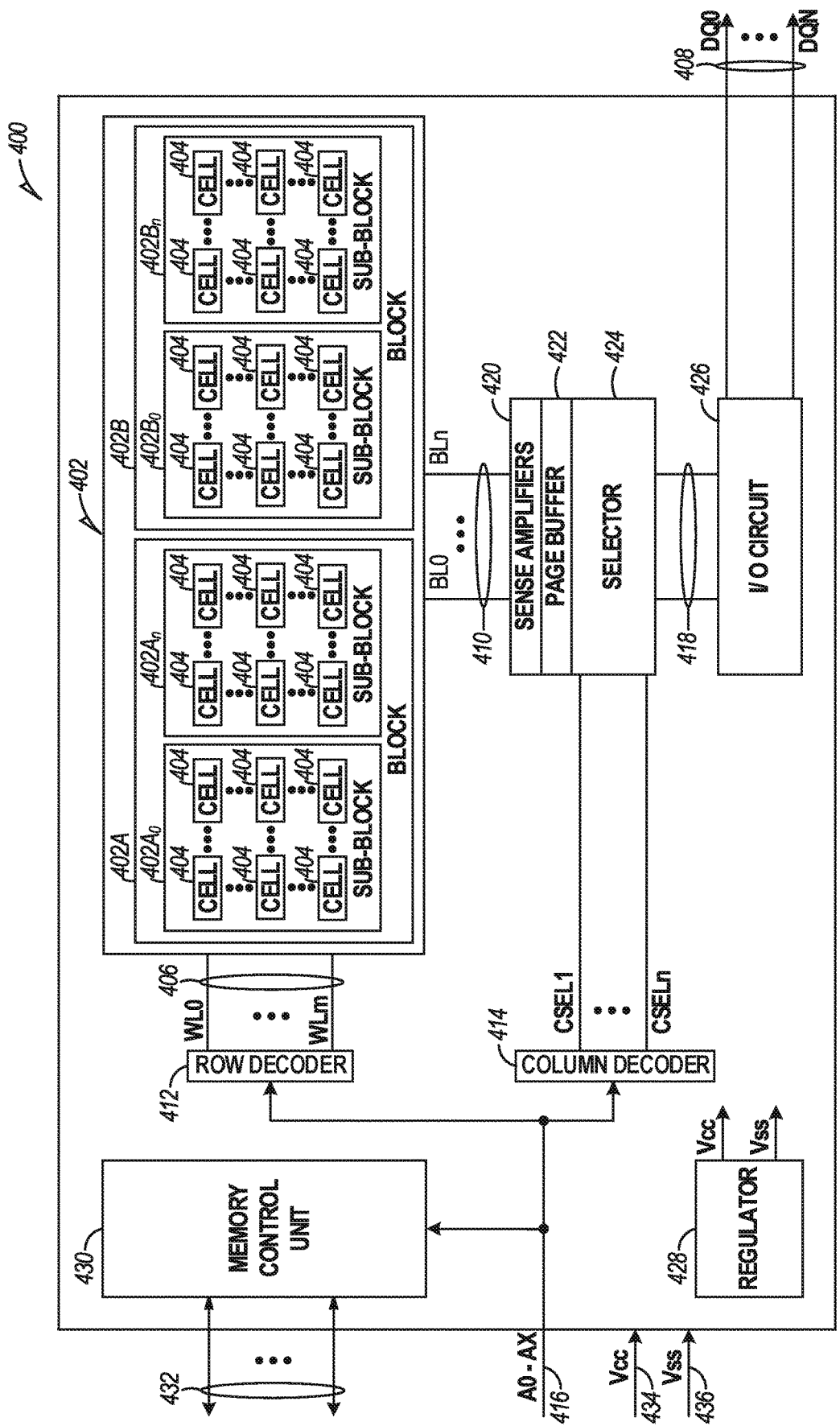
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Figure 5:
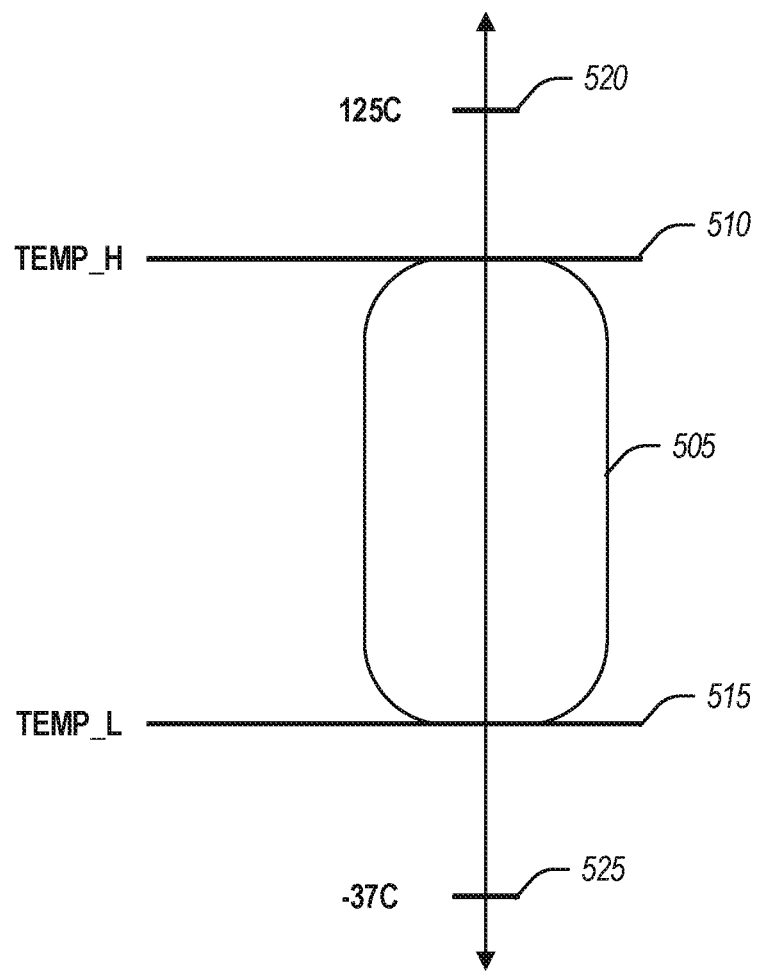
FIG. 5 illustrates an example of setting a temperature window.
Figure 6:
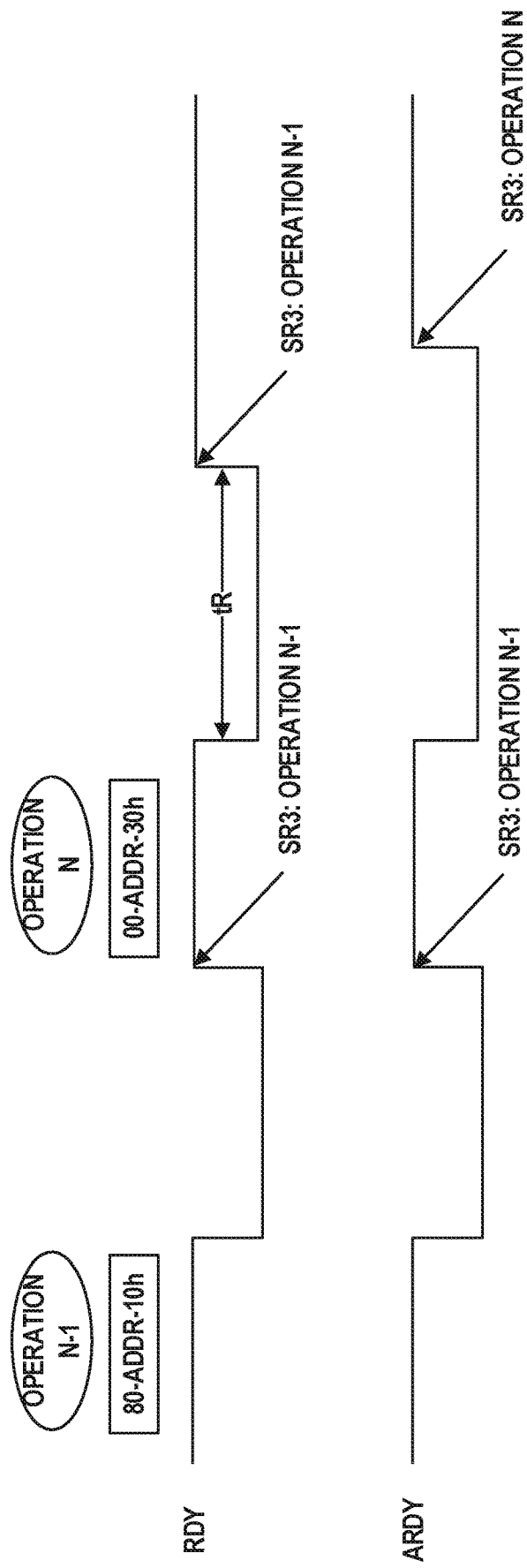
FIGS. 6-13 illustrate various waveform examples for communicating a thermal condition.
Figure 7:
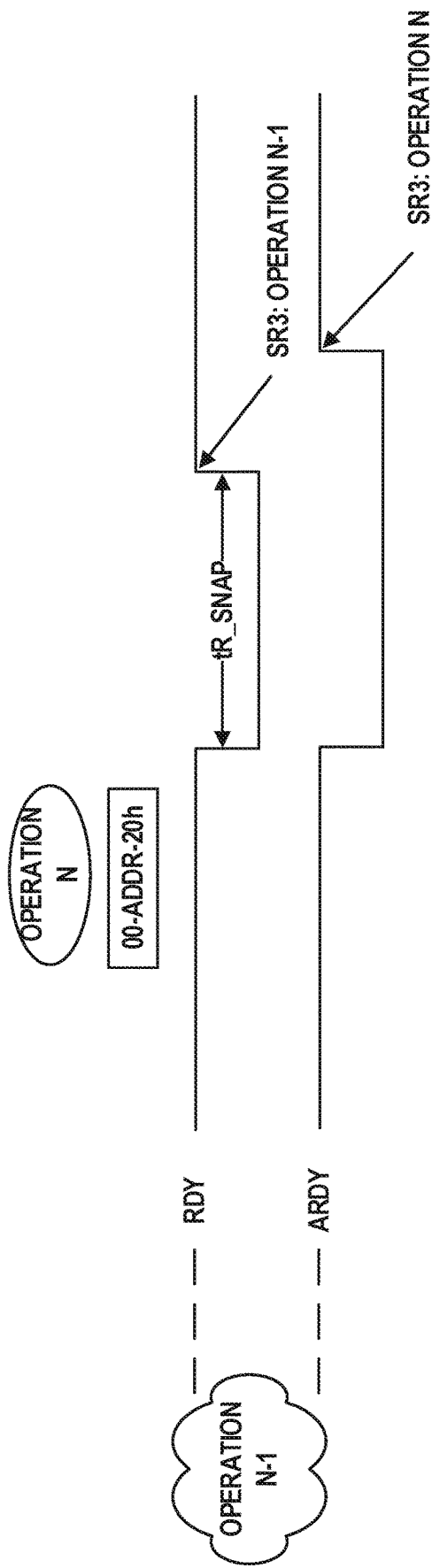
Figure 8:
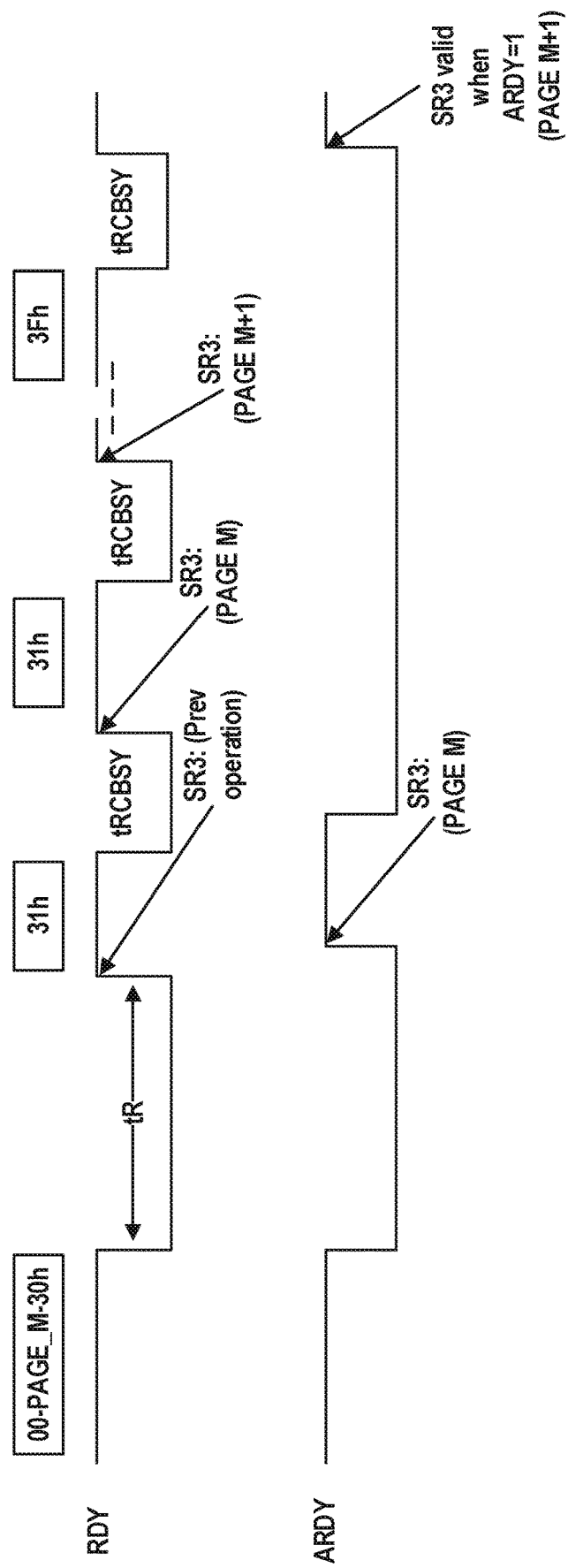
Figure 9:
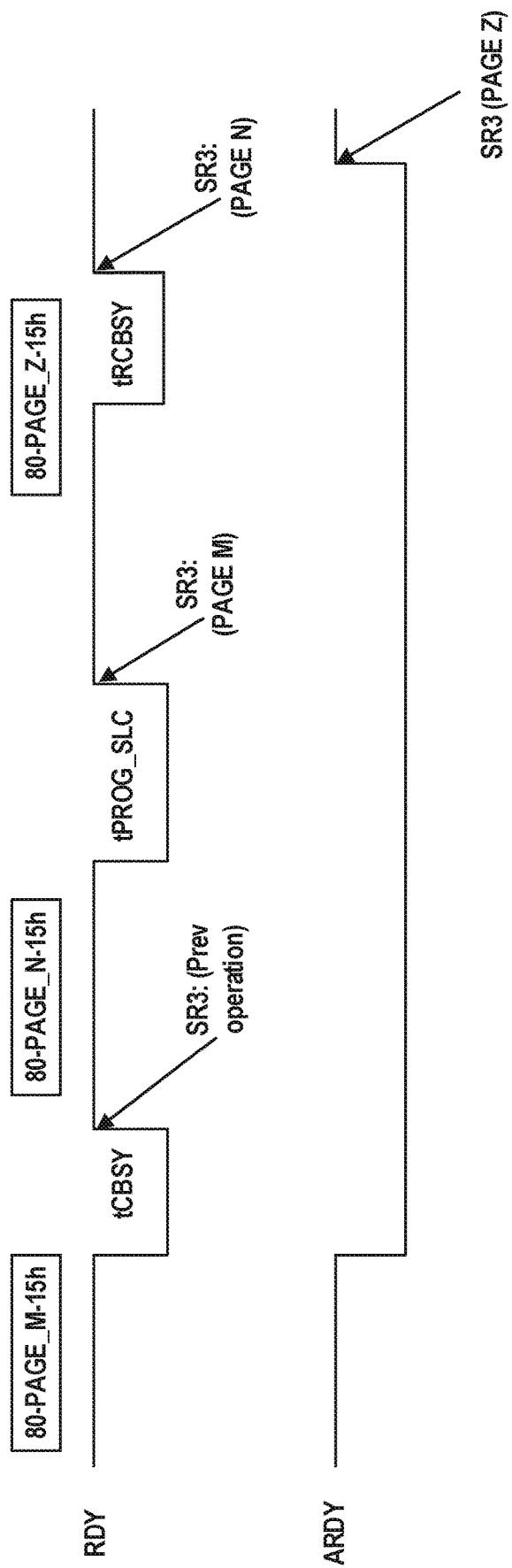
Figure 10:
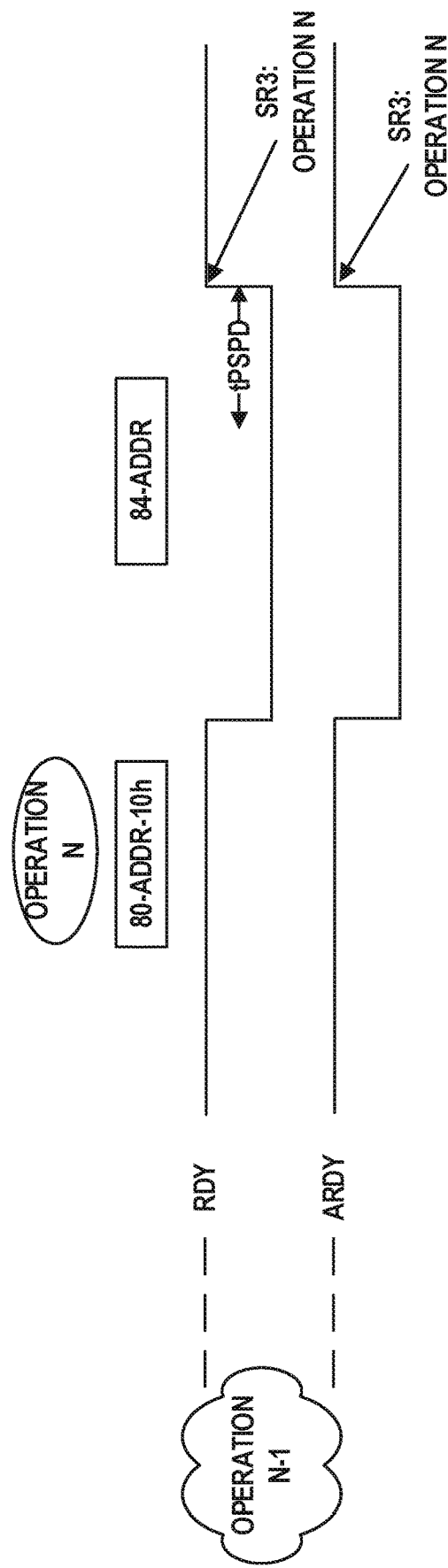
Figure 11:
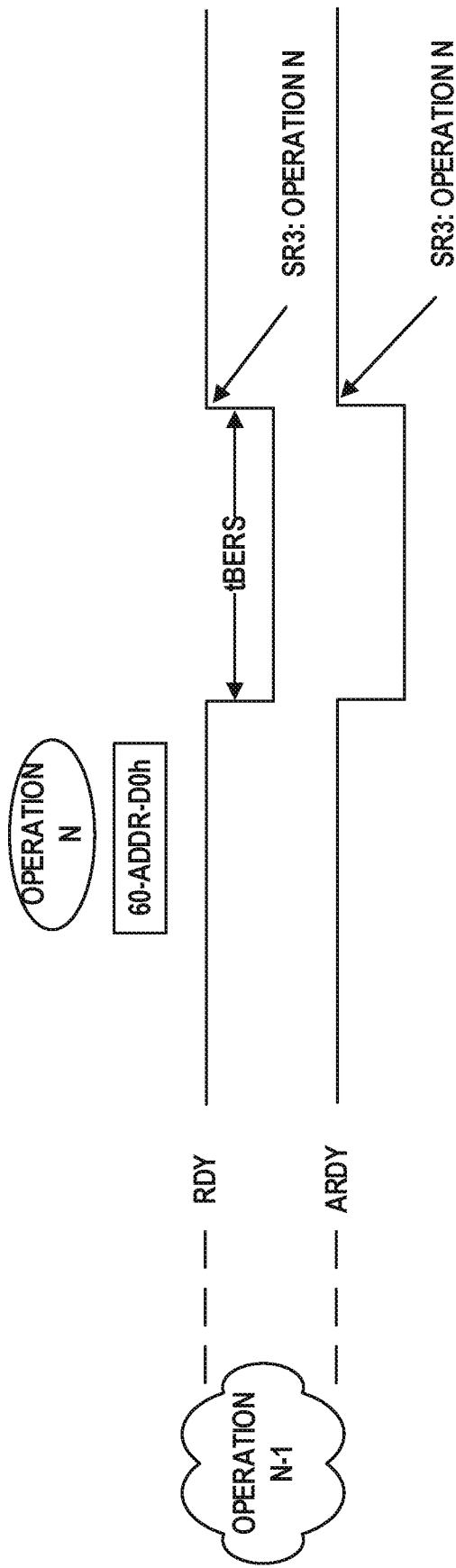
Figure 12:
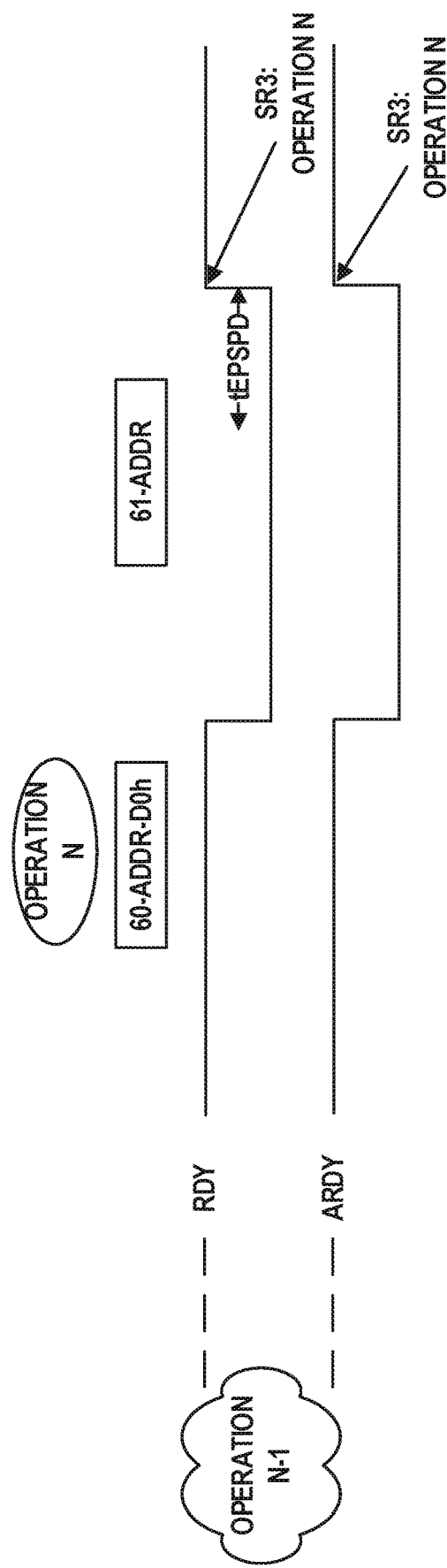
Figure 13:
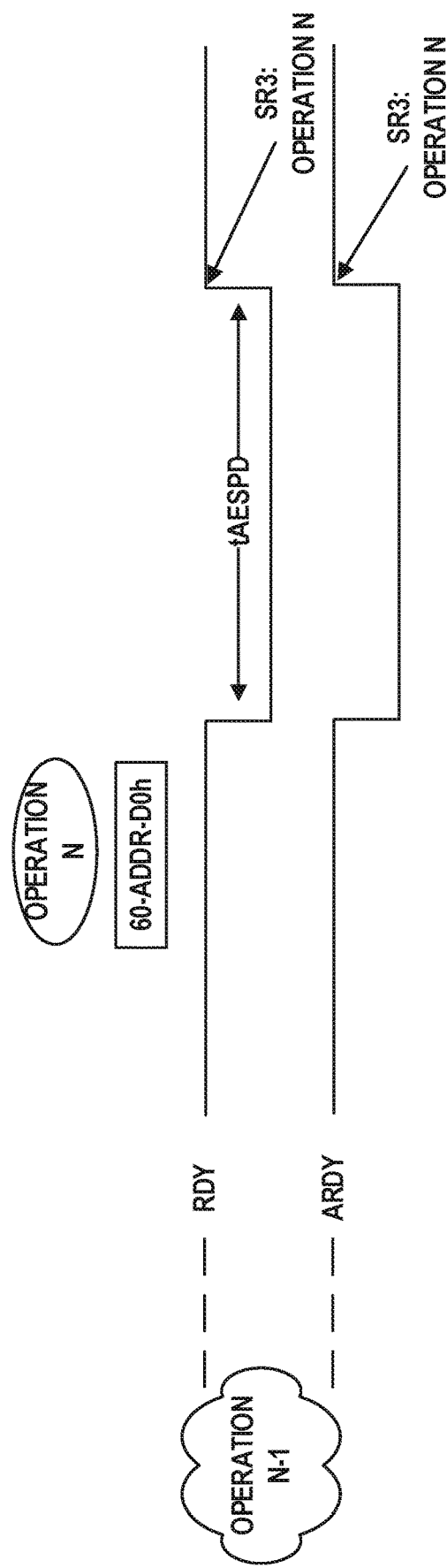

FIG. 5 illustrates an example of setting a temperature window 520 (e.g., range). In an example, when the thermal alert feature is enabled, the controller evaluates the temperature against thresholds TEMP_H 510 and TEMP_L 515. In an example, the temperature thresholds are configured using MLBi. In an example, thermal evaluation occurs only during valid program/read/erase operations. In an example, based on the evaluated thermal condition, the controller sets status bit 3 (SR3) to one or zero. In an example, SR3 is updated at the end of valid array operation (such as those listed in the table below). In an example, this bit remains sticky (e.g., doesn't change) until the thermal condition is revaluated in a subsequent valid operation. In an example, SR3 is updated at the end of a valid operation before ARDY is set to 1. Thus, the host may interpret the condition of SR3 as follows: if SR3 is set to 1, the temperature is greater than TEMP_H 510 or the temperature is less than TEMP_L 515; otherwise, SR3 is 0 and the temperature is between TEMP_L 515 and TEMP_H 510.

| OPERATION | THERMAL EVALUATION |
| --- | --- |
| Read Page | YES |
| Read Cache Sequence | YES |
| Read Cache Random | YES |
| Read Cache Last | YES |
| Snap Read | YES |
| Read Retry/MRR/Corrective Read | YES |
| Set/Get Feature | NO |
| MLBi, eMLBi | NO |
| Soft Read (SBR), Channel Calibration (CC), Single Bit SBR (SBSBR) | YES |
| Program | YES |
| OTP Program | YES |
| Cache Program | YES |
| Erase Suspend and Resume/Auto Erase Suspend | YES |
| Program Suspend | YES |
| Program Resume | YES |
| Read Unique ID/Read Param. Page | NO |
| Reset (FF, FA, FC) | NO |

In an example, the reset operation in the table above clear the thermal alert status (e.g., sets it to zero).

In an example, the thermal alert feature supports temperature ranges similar to the temperature readout provided through Get Feature (EEh) and Get MLBi (EAh), such as a lower bound 525 of −37 C and an upper bound 520 of 90 C at resolution of 1 C, and an extended range of a lower bound 525 at −37 C to an upper bound 520 at 125 C with resolution of 1 C.

To enable thermal alert feature, trims: TEMP_L 515 and TEMP_H 510 are set within valid range (e.g., between the lower bound 525 and the upper bound 510). To disable the feature, the trims TEMP_L and TEMP_H are set beyond a valid range. For example, the host may set TEMP_L 515 beyond the lower bound 525 to −40 C and set TEMP_H 510 beyond the upper bound 520 to +120 C) to disable the thermal alert feature.

Thermal Level detection measured (e.g., a specific temperature may be tested) by independently configuring TEMP_L 515 and TEMP_H 510. For example, setting TEMP_L 515 below the lower bound 525 and setting TEMP_H 510 to a temperature value results in detection of the die proceeding above the TEMP_H 510 value.

FIGS. 6-13 illustrate various waveform examples for communicating a thermal condition. Each of the figures is labeled to indicate which operation is illustrated and shows the ready (RDY) and asynchronous ready (ARDY) waveforms at which the status register bit (e.g., SR3) is set.

Figure 14:
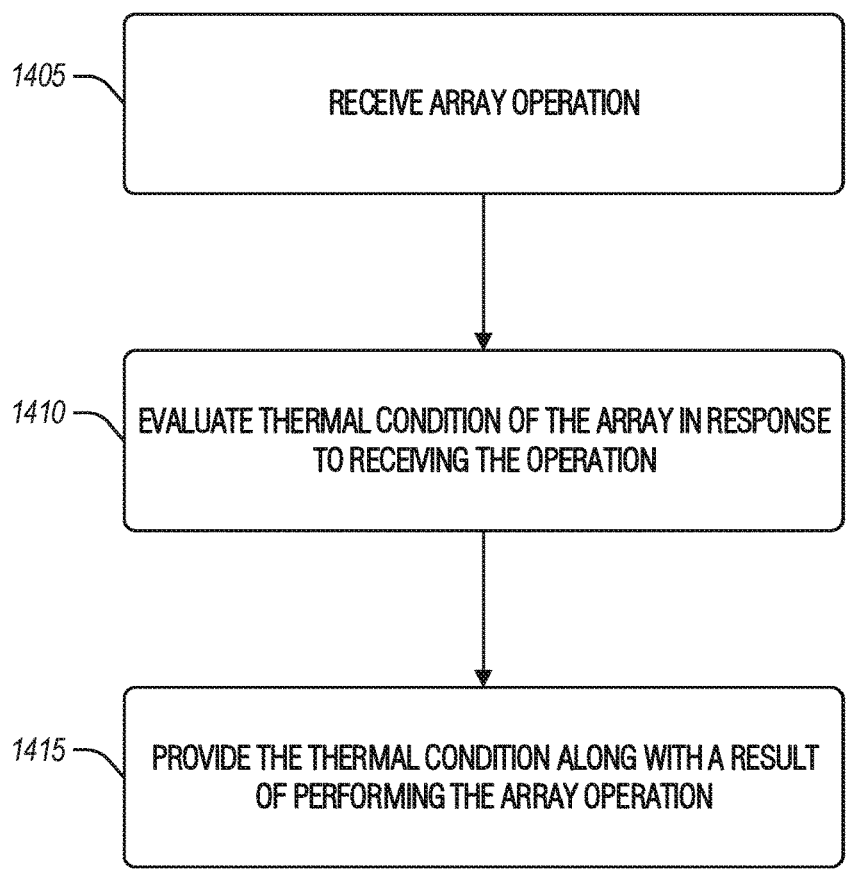
FIG. 14 illustrates a flowchart of an example of a method for NAND flash thermal alerting.

FIG. 14 illustrates a flowchart of an example of a method 1400 for NAND flash thermal alerting. The operations of the method 1400 are performed by hardware, such as that described above with respect to FIGS. 1-5, and below with respect to FIG. 15 (e.g., processing circuitry).

At operation 1405, a NAND array operation is received at controller of a storage device. Here, the storage device includes a NAND array. In an example, the NAND array operation is read page. In an example, the NAND array operation is read cache sequence. In an example, the NAND array operation is read cache random. In an example, the NAND array operation is read cache last. In an example, the NAND array operation is snap read. In an example, the NAND array operation is read retry. In an example, the NAND array operation is moving read reference. In an example, the NAND array operation is corrective read. In an example, the NAND array operation is soft read. In an example, the NAND array operation is channel calibration. In an example, the NAND array operation is single bit soft read. In an example, the NAND array operation is program. In an example, the NAND array operation is one-time-programmable (OTP) program. In an example, the NAND array operation is cache program. In an example, the NAND array operation is erase suspend and resume. In an example, the NAND array operation is auto erase suspend. In an example, the NAND array operation is program resume.

In an example, the NAND array operation is not set feature. In an example, the NAND array operation is not get feature. In an example, the NAND array operation is not media-local-bus interface (MLBi). In an example, the NAND array operation is not enhanced media-local-bus interface (eMLBi). In an example, the NAND array operation is not program suspend. In an example, the NAND array operation is not read unique identification (ID). In an example, the NAND array operation is not read parameter page. In an example, the NAND array operation is not reset. In an example, the NAND array operation operates on a die of the NAND array.

At operation 1410, the controller evaluates a thermal condition of the NAND array in response to receipt of the NAND array operation. In an example, evaluating the thermal condition includes retrieving a temperature from a thermometer of the die. In an example, evaluating the thermal condition includes applying a quantification to the temperature. In an example, the quantification is selected from a finite set of quantifications. In an example, evaluating the thermal condition includes comparing the temperature to a threshold. In an example, the finite set of quantifications has two members; a first member to indicate that the thermal condition is beyond the threshold and a second member to indicate that the thermal condition is not beyond the threshold.

In an example, the threshold is a temperature range. In an example, the first member indicates that the temperature is outside of the range and the second member indicates that the temperature is within the range. In an example, the range is set at the controller by a MLBi command from a host device. In an example, the temperature range has a lower bound of negative thirty-seven degrees Celsius and an upper bound of ninety degrees Celsius with a resolution of one degree Celsius. In an example, the temperature range has a lower bound of negative thirty-seven degrees Celsius and an upper bound of one hundred and fifteen degrees Celsius with a resolution of one point two degrees Celsius. In an example, the method 1400 is extend to also disable the evaluation of the thermal condition in response a range setting with a lower bound and upper bound outside of a pre-determined values.

At operation 1415, the controller communicates the thermal condition along with a result of the NAND array operation. In an example, communicating the thermal condition includes setting a status bit with first member value or a second member value. In an example, the status bit is bit three in a status register for the NAND array operation. In an example, the status bit is not changed until a reset operation or another NAND array operation for the die.

Figure 15:
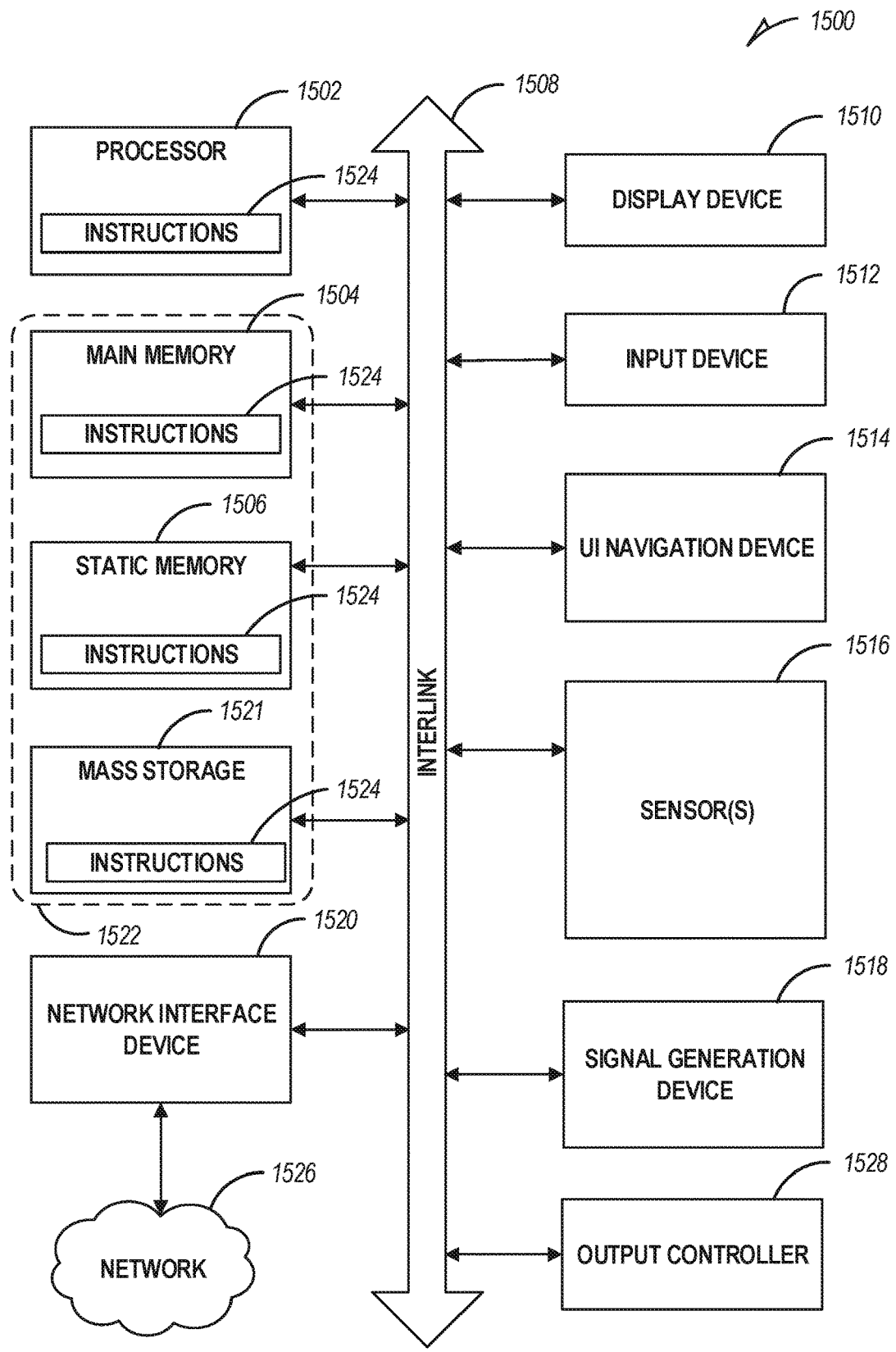
FIG. 15 is a block diagram illustrating an example of a machine upon which one or more embodiments may be implemented.

FIG. 15 illustrates a block diagram of an example machine 1500 upon which any one or more of the techniques (e.g., methodologies) discussed herein may perform. In alternative embodiments, the machine 1500 may operate as a standalone device or may be connected (e.g., networked) to other machines. In a networked deployment, the machine 1500 may operate in the capacity of a server machine, a client machine, or both in server-client network environments. In an example, the machine 1500 may act as a peer machine in peer-to-peer (P2P) (or other distributed) network environment. The machine 1500 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, movable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1500 (e.g., the host device 105, the memory device 110, etc.) may include a hardware processor 1502 (e.g., a central processing unit (CPU), a graphics processing unit (GPU), a hardware processor core, or any combination thereof, such as the memory controller 115, etc.), a main memory 1504 and a static memory 1506, some or all of which may communicate with each other via an interlink (e.g., bus) 1508. The machine 1500 may further include a display unit 1510, an alphanumeric input device 1512 (e.g., a keyboard), and a user interface (UI) navigation device 1514 (e.g., a mouse). In an example, the display unit 1510, input device 1512 and UI navigation device 1514 may be a touch screen display. The machine 1500 may additionally include a storage device (e.g., drive unit) 1516, a signal generation device 1518 (e.g., a speaker), a network interface device 1520, and one or more sensors 1516, such as a global positioning system (GPS) sensor, compass, accelerometer, or other sensor. The machine 1500 may include an output controller 1528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1516 may include a machine readable medium 1522 on which is stored one or more sets of data structures or instructions 1524 (e.g., software) embodying or utilized by any one or more of the techniques or functions described herein. The instructions 1524 may also reside, completely or at least partially, within the main memory 1504, within static memory 1506, or within the hardware processor 1502 during execution thereof by the machine 1500. In an example, one or any combination of the hardware processor 1502, the main memory 1504, the static memory 1506, or the storage device 1516 may constitute the machine readable medium 1522.

While the machine readable medium 1522 is illustrated as a single medium, the term "machine readable medium" may include a single medium or multiple media (e.g., a centralized or distributed database, or associated caches and servers) configured to store the one or more instructions 1524.

The term "machine readable medium" may include any medium that is capable of storing, encoding, or carrying instructions for execution by the machine 1500 and that cause the machine 1500 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1524 (e.g., software, programs, an operating system (OS), etc.) or other data are stored on the storage device 1521, can be accessed by the memory 1504 for use by the processor 1502. The memory 1504 (e.g., DRAM) is typically fast, but volatile, and thus a different type of storage than the storage device 1521 (e.g., an SSD), which is suitable for long-term storage, including while in an "off" condition. The instructions 1524 or data in use by a user or the machine 1500 are typically loaded in the memory 1504 for use by the processor 1502. When the memory 1504 is full, virtual space from the storage device 1521 can be allocated to supplement the memory 1504; however, because the storage 1521 device is typically slower than the memory 1504, and write speeds are typically at least twice as slow as read speeds, use of virtual memory can greatly reduce user experience due to storage device latency (in contrast to the memory 1504, e.g., DRAM). Further, use of the storage device 1521 for virtual memory can greatly reduce the usable lifespan of the storage device 1521.

In contrast to virtual memory, virtual memory compression (e.g., the Linux® kernel feature "ZRAM") uses part of the memory as compressed block storage to avoid paging to the storage device 1521. Paging takes place in the compressed block until it is necessary to write such data to the storage device 1521. Virtual memory compression increases the usable size of memory 1504, while reducing wear on the storage device 1521.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1524 may further be transmitted or received over a communications network 1526 using a transmission medium via the network interface device 1520 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1520 may include one or more physical jacks (e.g., Ethernet, coaxial, or phone jacks) or one or more antennas to connect to the communications network 1526. In an example, the network interface device 1520 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1500, and includes digital or analog communications signals or other intangible medium to facilitate communication of such software.

ADDITIONAL EXAMPLES

Example 1 is a NAND device for NAND Flash thermal alerting, the NAND device comprising: a NAND array; and a controller to: receive a NAND array operation; evaluate a thermal condition of the NAND array in response to receipt of the NAND array operation; and communicate the thermal condition along with a result of the NAND array operation.

In Example 2, the subject matter of Example 1 includes, wherein the NAND array operation operates on a die of the NAND array.

In Example 3, the subject matter of Example 2 includes, wherein, to evaluate the thermal condition, the controller retrieves a temperature from a thermometer of the die.

In Example 4, the subject matter of Example 3 includes, wherein, to evaluate the thermal condition, the controller applies a quantification to the temperature, the quantification selected from a finite set of quantifications.

In Example 5, the subject matter of Example 4 includes, wherein, to evaluate the thermal condition, the controller compares the temperature to a threshold, and wherein the finite set of quantifications has two members, a first member to indicate that the thermal condition is beyond the threshold and a second member to indicate that the thermal condition is not beyond the threshold.

In Example 6, the subject matter of Example 5 includes, wherein the threshold is a temperature range, and wherein the first member indicates that the temperature is outside of the range and the second member indicates that the temperature is within the range.

In Example 7, the subject matter of Example 6 includes, wherein the range is set at the controller by a media-local-bus interface command from a host device.

In Example 8, the subject matter of Example 7 includes, wherein the temperature range has a lower bound of negative thirty-seven degrees Celsius and an upper bound of ninety degrees Celsius with a resolution of one degree Celsius.

In Example 9, the subject matter of Examples 7-8 includes, wherein the temperature range has a lower bound of negative thirty-seven degrees Celsius and an upper bound of one hundred and twenty five degrees Celsius with a resolution of one degree Celsius.

In Example 10, the subject matter of Examples 7-9 includes, wherein the controller is to disable evaluation of the thermal condition in response a range setting with a lower bound and upper bound outside of a pre-determined values.

In Example 11, the subject matter of Examples 5-10 includes, wherein, to communicate the thermal condition, the controller sets a status bit with first member value or a second member value.

In Example 12, the subject matter of Example 11 includes, wherein the status bit is bit three in a status register for the NAND array operation.

In Example 13, the subject matter of Examples 11-12 includes, wherein the status bit is not changed until a reset operation or another NAND array operation for the die.

In Example 14, the subject matter of Examples 1-13 includes, wherein the NAND array operation is one of read page, read cache sequence, read cache random, read cache last, snap read, read retry, moving read reference, corrective read, soft read, channel calibration, single bit soft read, program, one-time-programmable program, cache program, erase suspend and resume, auto erase suspend, program resume, or program suspend-and-resume.

In Example 15, the subject matter of Examples 1-14 includes, wherein the NAND array operation is not one of set feature, get feature, media-local-bus interface, enhanced media-local-bus interface, read unique identification, read parameter page, or reset.

Example 16 is a method for NAND Flash thermal alerting, the method comprising: receiving NAND array operation at a controller of a storage device that includes, a NAND array; evaluating, by the controller, a thermal condition of the NAND array in response to receipt of the NAND array operation; and communicating, by the controller, the thermal condition along with a result of the NAND array operation.

In Example 17, the subject matter of Example 16 includes, wherein the NAND array operation operates on a die of the NAND array.

In Example 18, the subject matter of Example 17 includes, wherein evaluating the thermal condition includes retrieving a temperature from a thermometer of the die.

In Example 19, the subject matter of Example 18 includes, wherein evaluating the thermal condition includes applying a quantification to the temperature, the quantification selected from a finite set of quantifications.

In Example 20, the subject matter of Example 19 includes, wherein evaluating the thermal condition includes comparing the temperature to a threshold, and wherein the finite set of quantifications has two members, a first member to indicate that the thermal condition is beyond the threshold and a second member to indicate that the thermal condition is not beyond the threshold.

In Example 21, the subject matter of Example 20 includes, wherein the threshold is a temperature range, and wherein the first member indicates that the temperature is outside of the range and the second member indicates that the temperature is within the range.

In Example 22, the subject matter of Example 21 includes, wherein the range is set at the controller by a media-local-bus interface command from a host device.

In Example 23, the subject matter of Example 22 includes, wherein the temperature range has a lower bound of negative thirty-seven degrees Celsius and an upper bound of ninety degrees Celsius with a resolution of one degree Celsius.

In Example 24, the subject matter of Examples 22-23 includes, wherein the temperature range has a lower bound of negative thirty-seven degrees Celsius and an upper bound of one hundred and twenty five degrees Celsius with a resolution of one degree Celsius.

In Example 25, the subject matter of Examples 22-24 includes, disabling evaluating the thermal condition in response a range setting with a lower bound and upper bound outside of a pre-determined values.

In Example 26, the subject matter of Examples 20-25 includes, wherein communicating the thermal condition includes setting a status bit with first member value or a second member value.

In Example 27, the subject matter of Example 26 includes, wherein the status bit is bit three in a status register for the NAND array operation.

In Example 28, the subject matter of Examples 26-27 includes, wherein the status bit is not changed until a reset operation or another NAND array operation for the die.

In Example 29, the subject matter of Examples 16-28 includes, wherein the NAND array operation is one of read page, read cache sequence, read cache random, read cache last, snap read, read retry, moving read reference, corrective read, soft read, channel calibration, single bit soft read, program, one-time-programmable program, cache program, erase suspend and resume, auto erase suspend, program resume, or program suspend-and-resume.

In Example 30, the subject matter of Examples 16-29 includes, wherein the NAND array operation is not one of set feature, get feature, media-local-bus interface, enhanced media-local-bus interface, read unique identification, read parameter page, or reset.

Example 31 is at least one machine readable medium including instructions that, when executed by processing circuitry, cause the processing circuitry to perform any method of Examples 16-30.

Example 32 is a system comprising means to perform any method of Examples 16-30.

Example 33 is at least one machine readable medium including instructions that, when executed by processing circuitry, cause the processing circuitry to perform operations comprising: receiving NAND array operation at a controller of a storage device that includes, a NAND array; evaluating, by the controller, a thermal condition of the NAND array in response to receipt of the NAND array operation; and communicating, by the controller, the thermal condition along with a result of the NAND array operation.

In Example 34, the subject matter of Example 33 includes, wherein the NAND array operation operates on a die of the NAND array.

In Example 35, the subject matter of Example 34 includes, wherein evaluating the thermal condition includes retrieving a temperature from a thermometer of the die.

In Example 36, the subject matter of Example 35 includes, wherein evaluating the thermal condition includes applying a quantification to the temperature, the quantification selected from a finite set of quantifications.

In Example 37, the subject matter of Example 36 includes, wherein evaluating the thermal condition includes comparing the temperature to a threshold, and wherein the finite set of quantifications has two members, a first member to indicate that the thermal condition is beyond the threshold and a second member to indicate that the thermal condition is not beyond the threshold.

In Example 38, the subject matter of Example 37 includes, wherein the threshold is a temperature range, and wherein the first member indicates that the temperature is outside of the range and the second member indicates that the temperature is within the range.

In Example 39, the subject matter of Example 38 includes, wherein the range is set at the controller by a media-local-bus interface command from a host device.

In Example 40, the subject matter of Example 39 includes, wherein the temperature range has a lower bound of negative thirty-seven degrees Celsius and an upper bound of ninety degrees Celsius with a resolution of one degree Celsius.

In Example 41, the subject matter of Examples 39-40 includes, wherein the temperature range has a lower bound of negative thirty-seven degrees Celsius and an upper bound of one hundred and twenty five degrees Celsius with a resolution of one degree Celsius.

In Example 42, the subject matter of Examples 39-41 includes, wherein the operations comprise disabling evaluating the thermal condition in response a range setting with a lower bound and upper bound outside of a pre-determined values.

In Example 43, the subject matter of Examples 37-42 includes, wherein communicating the thermal condition includes setting a status bit with first member value or a second member value.

In Example 44, the subject matter of Example 43 includes, wherein the status bit is bit three in a status register for the NAND array operation.

In Example 45, the subject matter of Examples 43-44 includes, wherein the status bit is not changed until a reset operation or another NAND array operation for the die.

In Example 46, the subject matter of Examples 33-45 includes, wherein the NAND array operation is one of read page, read cache sequence, read cache random, read cache last, snap read, read retry, moving read reference, corrective read, soft read, channel calibration, single bit soft read, program, one-time-programmable program, cache program, erase suspend and resume, auto erase suspend, program resume, or program suspend-and-resume.

In Example 47, the subject matter of Examples 33-46 includes, wherein the NAND array operation is not one of set feature, get feature, media-local-bus interface, enhanced media-local-bus interface, read unique identification, read parameter page, or reset.

Example 48 is a system for NAND Flash thermal alerting, the system comprising: means for receiving NAND array operation at a controller of a storage device that includes, a NAND array; means for evaluating, by the controller, a thermal condition of the NAND array in response to receipt of the NAND array operation; and means for communicating, by the controller, the thermal condition along with a result of the NAND array operation.

In Example 49, the subject matter of Example 48 includes, wherein the NAND array operation operates on a die of the NAND array.

In Example 50, the subject matter of Example 49 includes, wherein the means for evaluating the thermal condition include means for retrieving a temperature from a thermometer of the die.

In Example 51, the subject matter of Example 50 includes, wherein the means for evaluating the thermal condition include means for applying a quantification to the temperature, the quantification selected from a finite set of quantifications.

In Example 52, the subject matter of Example 51 includes, wherein the means for evaluating the thermal condition include means for comparing the temperature to a threshold, and wherein the finite set of quantifications has two members, a first member to indicate that the thermal condition is beyond the threshold and a second member to indicate that the thermal condition is not beyond the threshold.

In Example 53, the subject matter of Example 52 includes, wherein the threshold is a temperature range, and wherein the first member indicates that the temperature is outside of the range and the second member indicates that the temperature is within the range.

In Example 54, the subject matter of Example 53 includes, wherein the range is set at the controller by a media-local-bus interface command from a host device.

In Example 55, the subject matter of Example 54 includes, wherein the temperature range has a lower bound of negative thirty-seven degrees Celsius and an upper bound of ninety degrees Celsius with a resolution of one degree Celsius.

In Example 56, the subject matter of Examples 54-55 includes, wherein the temperature range has a lower bound of negative thirty-seven degrees Celsius and an upper bound of one hundred and twenty five Celsius with a resolution of one degree Celsius.

In Example 57, the subject matter of Examples 54-56 includes, means for disabling evaluating the thermal condition in response a range setting with a lower bound and upper bound outside of a pre-determined values.

In Example 58, the subject matter of Examples 52-57 includes, wherein the means for communicating the thermal condition include means for setting a status bit with first member value or a second member value.

In Example 59, the subject matter of Example 58 includes, wherein the status bit is bit three in a status register for the NAND array operation.

In Example 60, the subject matter of Examples 58-59 includes, wherein the status bit is not changed until a reset operation or another NAND array operation for the die.

In Example 61, the subject matter of Examples 48-60 includes, wherein the NAND array operation is one of read page, read cache sequence, read cache random, read cache last, snap read, read retry, moving read reference, corrective read, soft read, channel calibration, single bit soft read, program, one-time-programmable program, cache program, erase suspend and resume, auto erase suspend, program resume, or program suspend-and-resume.

In Example 62, the subject matter of Examples 48-61 includes, wherein the NAND array operation is not one of set feature, get feature, media-local-bus interface, enhanced media-local-bus interface, read unique identification, read parameter page, or reset.

Example 63 is at least one machine-readable medium including instructions that, when executed by processing circuitry, cause the processing circuitry to perform operations to implement of any of Examples 1-62.

Example 64 is an apparatus comprising means to implement of any of Examples 1-62.

Example 65 is a system to implement of any of Examples 1-62.

Example 66 is a method to implement of any of Examples 1-62.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "n" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a source-side select gate (SGS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A controller to communicate a thermal condition of a memory device, the controller comprising:
a memory cell die interface;
a host interface; and
circuitry configured to:
retrieve, via the memory cell die interface, a temperature from a memory cell die in response to an operation on the memory cell die, the memory cell die including memory cells;
store a representation of the temperature in the controller to create a stored representation of the temperature;
communicate, via the host interface, the stored representation of the temperature as part of a response to an operation received at the controller that corresponded to the operation on the memory cell die;
receive, via the host interface, a request for the thermal condition of the memory device; and
respond, via the host interface, to the request with the stored representation of the temperature without communicating with the memory cell die.

2. The controller of claim 1, wherein storing the representation of the temperature in the controller includes holding the representation of the temperature in a register of the host interface, wherein the host interface is a media-local-bus interface.

3. The controller of claim 2, wherein the representation of the temperature is a single bit in the register.

4. The controller of claim 3, wherein the single bit represents whether the temperature is over or under a threshold.

5. The controller of claim 3, wherein the single bit represents whether the temperature is inside or outside of a range.

6. The controller of claim 3, wherein the register is a media-local-bus status register, and wherein the single bit is bit three.

7. The controller of claim 5, wherein has a lower bound of negative thirty-seven degrees Celsius and an upper bound of ninety degrees Celsius or an upper bound of one hundred and twenty-five degrees Celsius.

8. The controller of claim 1, wherein the memory cells are NAND flash memory cells, and wherein the operation received at the controller that corresponded to the operation on the memory cell die is at least one of read page, read cache sequence, read cache random, read cache last, snap read, read retry, moving read reference, corrective read, soft read, channel calibration, single bit soft read, program, one-time-programmable program, cache program, erase suspend and resume, auto erase suspend, program resume, or program suspend-and-resume.

9. A method to communicate a thermal condition of a memory device, the method comprising:
retrieving, by a controller, a temperature from a memory cell die in response to an operation on the memory cell die, the memory cell die including memory cells;
storing a representation of the temperature in the controller to create a stored representation of the temperature;
communicating, by the controller, the stored representation of the temperature as part of a response to an operation received at the controller that corresponded to the operation on the memory cell die;
receiving a request, at the controller, for the thermal condition of the memory device; and
responding, by the controller, to the request with the stored representation of the temperature without communicating with the memory cell die.

10. The method of claim 9, wherein storing the representation of the temperature in the controller includes holding the representation of the temperature in a register of a media-local-bus interface to the controller.

11. The method of claim 10, wherein the representation of the temperature is a single bit in the register.

12. The method of claim 11, wherein the single bit represents whether the temperature is over or under a threshold.

13. The method of claim 11, wherein the single bit represents whether the temperature is inside or outside of a range.

14. The method of claim 11, wherein the register is a media-local-bus status register, and wherein the single bit is bit three.

15. The method of claim 13, wherein has a lower bound of negative thirty-seven degrees Celsius and an upper bound of ninety degrees Celsius or an upper bound of one hundred and twenty-five degrees Celsius.

16. The method of claim 9, wherein the memory cells are NAND flash memory cells, and wherein the operation received at the controller that corresponded to the operation on the memory cell die is at least one of read page, read cache sequence, read cache random, read cache last, snap read, read retry, moving read reference, corrective read, soft read, channel calibration, single bit soft read, program, one-time-programmable program, cache program, erase suspend and resume, auto erase suspend, program resume, or program suspend-and-resume.

17. A non-transitory machine-readable medium including instructions to communicate a thermal condition of a memory device, the instructions, when executed, cause circuitry of a controller to perform operations comprising:
retrieving a temperature from a memory cell die in response to an operation on the memory cell die, the memory cell die including memory cells;
storing a representation of the temperature in the controller to create a stored representation of the temperature;
communicating the stored representation of the temperature as part of a response to an operation received at the controller that corresponded to the operation on the memory cell die;
receiving a request for the thermal condition of the memory device; and
responding to the request with the stored representation of the temperature without communicating with the memory cell die.

18. The non-transitory machine-readable medium of claim 17, wherein storing the representation of the temperature in the controller includes holding the representation of the temperature in a register of a media-local-bus interface to the controller.

19. The non-transitory machine-readable medium of claim 18, wherein the representation of the temperature is a single bit in the register.

20. The non-transitory machine-readable medium of claim 19, wherein the single bit represents whether the temperature is over or under a threshold.

21. The non-transitory machine-readable medium of claim 19, wherein the single bit represents whether the temperature is inside or outside of a range.

22. The non-transitory machine-readable medium of claim 19, wherein the register is a media-local-bus status register, and wherein the single bit is bit three.

23. The non-transitory machine-readable medium of claim 21, wherein has a lower bound of negative thirty-seven degrees Celsius and an upper bound of ninety degrees Celsius or an upper bound of one hundred and twenty-five degrees Celsius.

24. The non-transitory machine-readable medium of claim 17, wherein the memory cells are NAND flash memory cells, and wherein the operation received at the controller that corresponded to the operation on the memory cell die is at least one of read page, read cache sequence, read cache random, read cache last, snap read, read retry, moving read reference, corrective read, soft read, channel calibration, single bit soft read, program, one-time-programmable program, cache program, erase suspend and resume, auto erase suspend, program resume, or program suspend-and-resume.

\* \* \* \* \*